US005260853A

United States Patent [19]

Yap et al.

[11] Patent Number: 5,260,853

[45] Date of Patent: Nov. 9, 1993

[54] ANTENNA HOUSING ASSEMBLY WITH INTERLOCKING MEMBERS

[75] Inventors: Walter N. Yap; Howard M. Schenkel, both of Boca Raton, Fla.

[73] Assignee: Sensormatic Electronics Corporation, Deerfield Beach, Fla.

[21] Appl. No.: 951,909

[22] Filed: Sep. 28, 1992

[51] Int. Cl.[5] .......................... H05K 5/02; B65D 6/10

[52] U.S. Cl. .................................... 361/736; 361/724; 220/4.02; 220/684; 312/263

[58] Field of Search .................... 220/4.02, 4.21, 4.22, 220/4.33, 683, 684; 312/263, 265.5; 361/380, 390-395, 399; 174/48

[56] References Cited

U.S. PATENT DOCUMENTS 4,794,489 12/1988 Brown ............................ 361/395 X

*Primary Examiner*—Leo P. Picard
*Assistant Examiner*—Michael W. Phillips
*Attorney, Agent, or Firm*—Robin, Blecker, Daley & Driscoll

[57] ABSTRACT

An antenna housing comprising panels having lateral ends which are held together by interlocking end members which slidably engage the lateral ends. End caps engage the upper and lower parts of the lateral ends and end members to hold them together to provide an integrated, low profile aesthetically pleasing antenna housing.

21 Claims, 5 Drawing Sheets

ANTENNA HOUSING ASSEMBLY WITH INTERLOCKING MEMBERS

BACKGROUND OF THE INVENTION

This invention relates to electronic article surveillance (EAS) systems and, in particular, to antenna housings for use in such systems.

In EAS systems in use today, it is typical to employ antennas which transmit signals into a zone which is to be placed under interrogation. These signals interact with tags or markers placed on articles in order to sense or detect passage of the articles through the interrogation zone.

Interaction between a transmitted signal and a tag results in a response signal which is also detected by an antenna. The detected signal is then used to activate an alarm to indicate the presence of the tag and article in the interrogation zone.

In EAS systems of this type, the antennas have been housed in a variety of ways. Upstanding pedestals have been used with the antennas located in the pedestals. Also, ceiling mounts, floor mats and signs have been used, particularly where the antennas are situated adjacent to a doorway or other passageway.

While the antenna housings used previously have proved satisfactory, there is still a need for improved housings. This is especially true in applications where the antenna housings must be unobtrusive and attractive, as well as functional.

It is, therefore, an object of the present invention to provide an antenna housing which is more aesthetically pleasing.

It is also an object of the present invention to provide an antenna housing which has a low profile.

It is a further object of the present invention to provide an antenna housing which is simple and easy to assemble.

SUMMARY OF THE INVENTION

In accordance with the principles of the present invention, the above and other objects are realized in an antenna housing in which interlocking members are joined together to provide a housing with a low profile and a pleasing appearance. The antenna housing comprises first and second panels having lateral ends which are joined together by interlocking end members. These end members slidably engage the lateral ends and are held thereto by upper and lower end caps which bridge the end members and are releasably locked thereto.

In the embodiment of the invention to be disclosed hereinafter, the end members define channels having channel parts which extend around extensions on the lateral ends to provide the interlocking engagement. The end caps, in turn, have lower facing walls which straddle aligned slots provided in the extensions and end members, thereby holding them together. Bendable parts of these lower walls permit each end cap to be releasably locked to the respective end member.

Also, in this embodiment, one of the end members and the lateral ends joined by the end member are slotted along their lengths to permit slidable interlocking of one to the other at intermediate length positions. The slotted segments are covered by further skirt-like extensions at the lateral ends.

Central ribs on the opposing faces of the panels and notches in the lateral ends are used to provide a mechanism for centering the antenna and its accompanying PC boards. Additional notches in the lateral ends allow for support of decorative panels, while indentations in the outer surface of the end members carry an adhesive for securing the ends members to a support.

BRIEF DESCRIPTION OF THE DRAWINGS

The above and other features and aspects of the present invention will become more apparent upon reading the following detailed description, in conjunction with the accompanying drawings, in which.

DETAILED DESCRIPTION

Figure 1:
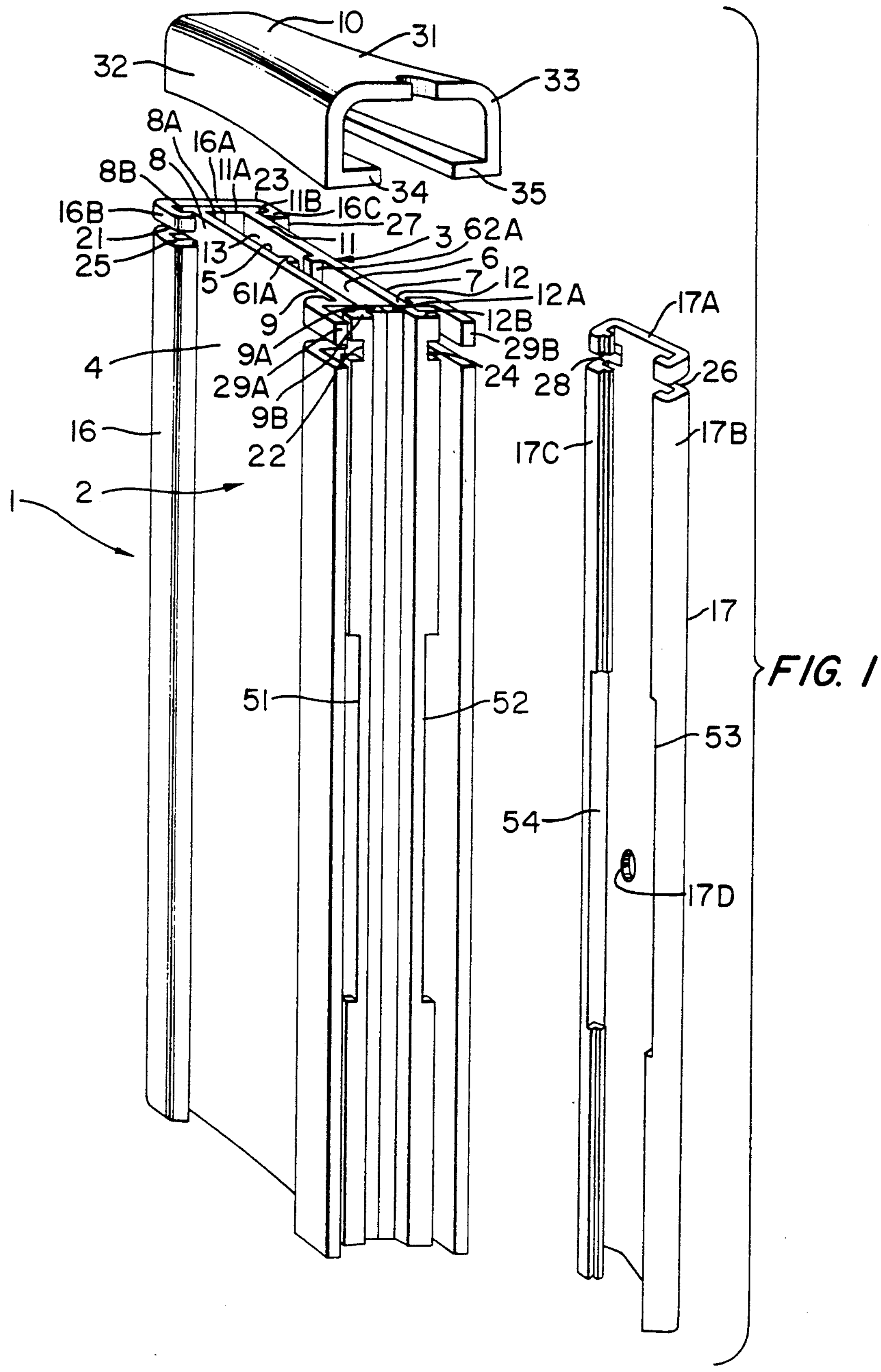
FIG. 1 shows an isometric partially disassembled view of the upper half of an antenna housing in accordance with the principles of the present invention.
Figure 2:
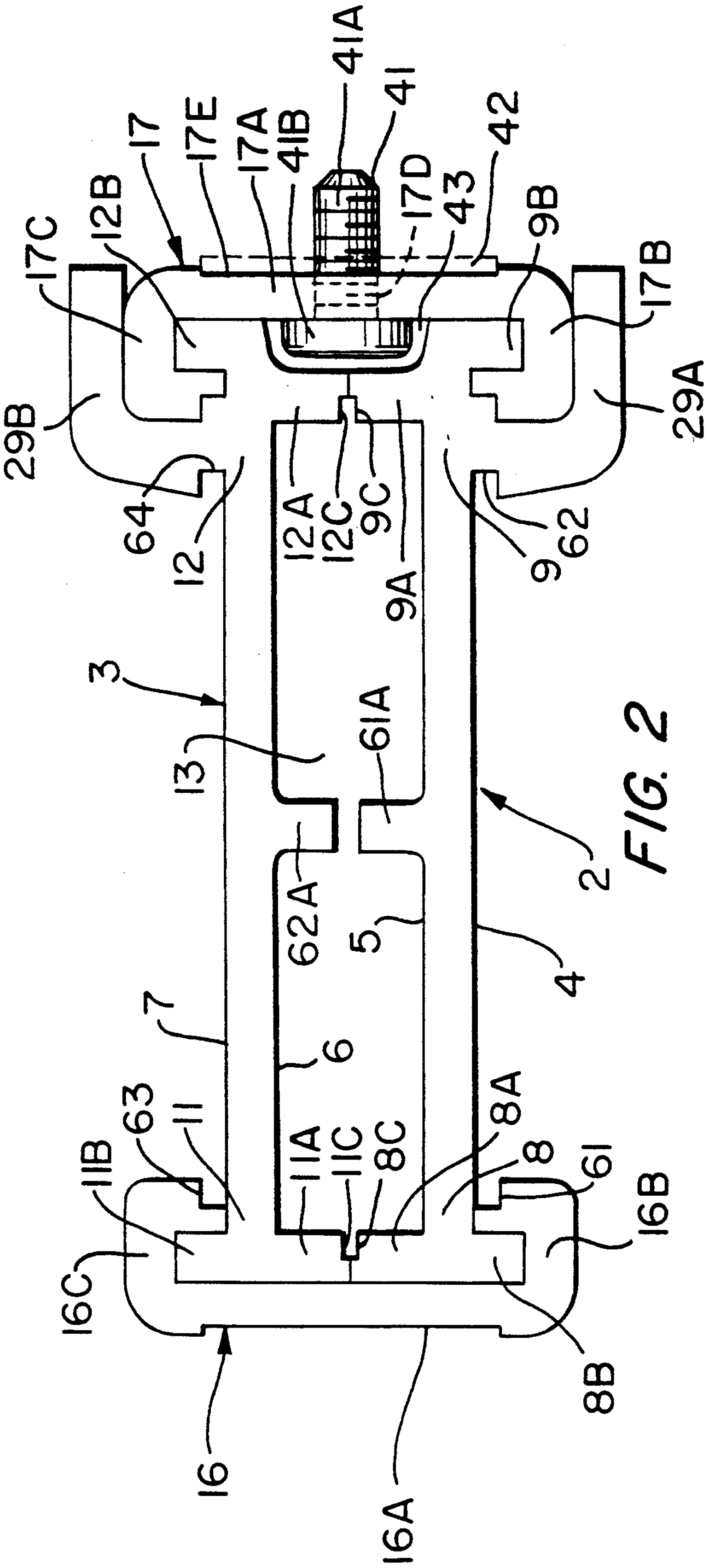
FIG. 2 shows a cross section of the housing of FIG. 1.
Figure 3B:
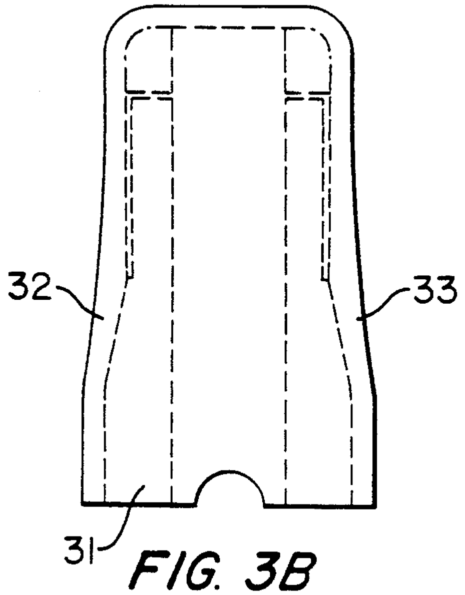
FIGS. 3A, 3B, 3C and 3D show front, top, bottom and side views of an end cap of the housing of FIG. 1.
Figure 3E:
FIG. 3E shows the details of a portion of the end cap of FIGS. 3A–3D.
Figure 3A:
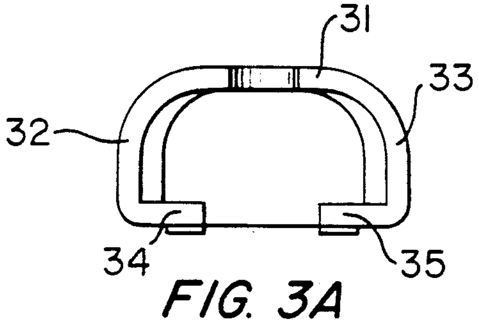
Figure 3D:
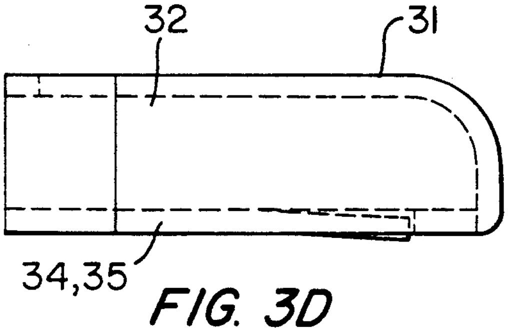
Figure 3C:
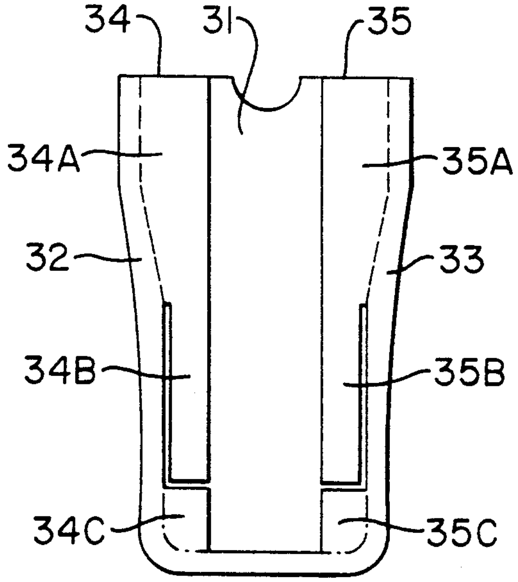

FIGS. 1, 2, 4 and 5 show various views of an antenna housing 1 in accordance with the principles of the present invention. As shown, the housing 1 includes first and second panels 2 and 3 each having first and second faces, shown as faces 5, 4 and 6, 7, respectively. The panels 2 and 3 also include first and second lateral ends 8, 9 and 11, 12, respectively. The lateral ends 8 and 9 have extensions 8A and 9A, shown as rectangular, which extend outwardly of the panel face 5. The lateral ends 11 and 12 also have extensions 11A and 12A, also shown as rectangular, which extend outward of the panel face 6.

With the faces 5 and 6 arranged in facing relationship so that the extension 8A abuts the extension 11A and the extension 9A abuts the extension 12A, the panels define an open space 13. This space houses the coils of an antenna 14, as well as a PC boards 14A and 14B (see FIGS. 4 and 5) located at opposite ends of the antenna.

Figure 4:
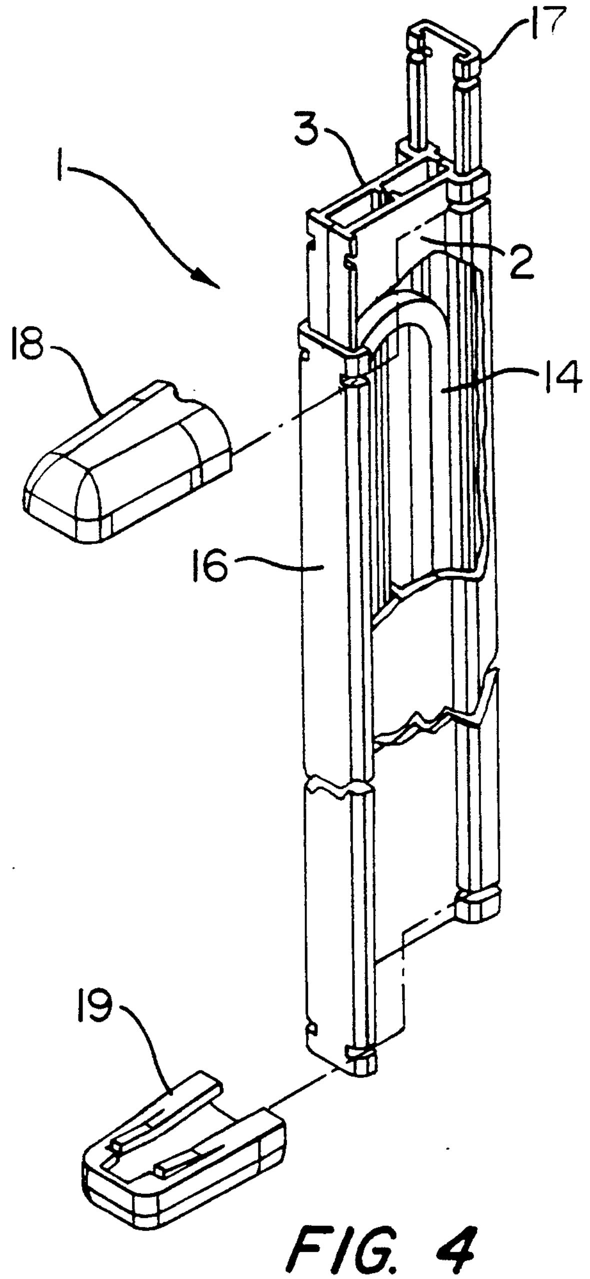
FIG. 4 shows a full view of the antenna housing of FIG. 1.
Figure 5:
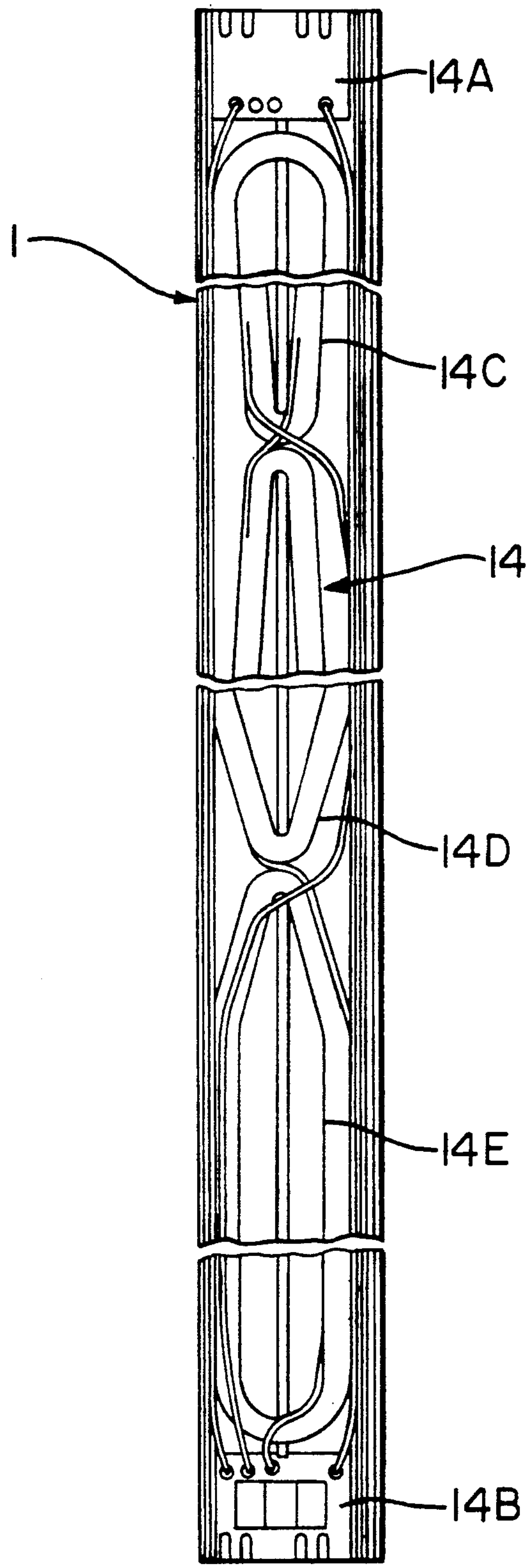
FIG. 5 shows a cross section through the length of the housing of FIG. 4.

In order to maintain the panels 2 and 3 in this relationship, the lateral ends of the panels are further adapted to cooperate with end members 16 and 17 and end caps 18 and 19 (see, FIG. 4). To this end, lateral ends 8 and 9 have further extensions 8B and 9B, shown as rectangular, which extend outward of the panel face 4 and the lateral ends 11 and 12 have extensions 11B and 12B, shown as rectangular, which extend outward from the panel face 7.

The end members 16 and 17, in turn, are formed as channel members having channel parts which can interlock with the extensions 8B, 11B and 9B, 12B, respectively. The end member 16 includes a central channel part 16A which connects two end channel parts 16B and 16C, shown as C-shaped. These channel parts slide over and extend around the extensions 8B, 11B. End member 17 also includes a central channel part 17A which connects two end channel parts 17B and 17C, also shown as C-shaped. The latter channel parts slide over and extend around the extensions 9B and 12B. The end members 16 and 17 thereby engage and hold the lateral ends 8, 11 and 9, 12 and, therefore, the panels 2 and 3 together.

End caps 18 and 19 are then used to hold the interlocked end members and panels together and to prevent sliding. This is accomplished via cooperation of the end caps with aligned slots in the upper and lower parts of the end members and the extensions.

In the present illustrative case, the lower end cap 19 has the same configuration as the upper end cap 18. Also, the slot configuration at the lower parts of the end members 16 and 17 and the extensions 8B, 9B, 11B, 12B is the same as that in their upper parts. The discussion to follow thus describes the upper cap 18 and the upper slot configuration, with the understanding that the lower cap 19 and lower slot configuration, respectively, are the same.

As can be seen in FIG. 1, the upper parts of the extensions 8B and 9B have slots 21 and 22 which extend through the thickness of the portions of the extensions surrounded by the corresponding end channel parts 16B and 17B, respectively. These slots begin at an outer surface of the extensions and extend inwardly toward the face 4 of the panel 2. Likewise, extensions 11B and 12B have slots 23 (not visible) and 24 which extend through the thickness of the portions of the extensions surrounded by the corresponding channel parts 16C and 17C. These slots also begin at an outer surface of the extensions and extend inwardly toward the face 7 of the panel 3.

The channel parts 16B and 17B in turn, have slots 25 and 26 aligned with the slots 21 and 22, respectively. The channel parts 16C and 17C also have slots 27 (not visible) and 28 aligned with the slots 23 and 24.

End cap 18 has an upper wall 31, side walls 32 and 33, which extend from the upper wall, and bottom walls 34 and 35 which extend inwardly toward each other. The side walls 32 and 33 expand outward at their forward end so as to provide gripping surfaces for urging or applying force to the end cap.

To attach the end cap 18 to the extensions and end members, the forward ends of the bottom walls 34 and 35 are passed through the aligned slots 21, 25 and 23, 27 and into engagement With the aligned slots 22, 26 and 24,28. In this position, the bottom walls 34 and 35 of the end cap engage both of the end members 16 and 17 and the extensions on the lateral ends of both panels. This holds the end members 16 and 17 and the panels 2 and 3 together and prevents any sliding of one relative to the other.

In order to lock the end cap 18 in position, bottom walls 34 and 35 include bendable middle sections 34B, 35B (see, FIG. 3). These sections follow the forward sections 34A, 35A of the bottom walls and are biased downward. Moreover, these sections are separated from both the end cap side walls 32, 33 and the lower wall end sections 34C, 35C so that the sections are able to bend upward when a force is applied to them and then retract or spring downward when such force is released.

When the end cap 18 is urged through the slots of the extensions of the lateral ends 8 and 11 and the slots of the end members, the downwardly biased middle sections 34B and 35B are urged upward. This upward force continues, until the middle sections pass beyond the slots of the end members and extensions. At this position. the upward force is released, allowing the middle sections 34B and 35B to spring down and thus abut the end channel parts 16B and 16C of the end member 16. This locks the end cap in place. The end cap can then be released by urging the middle sections 34B and 35B upward and moving the end cap rearward.

In order to allow the housing 1 to be attached to various surfaces or parts, the end member 17 (see, FIG. 2) is provided with an aperture or opening 17D through which the body 41A of a screw or other attaching bolt 41 can be passed to secure the end member to the desired surface. Also, a depression 17E in the central channel part 17A of the member 17 supports an adhesive strip 42 which can be used with or without the bolt to support the end member.

To accommodate the head 41B of the screw 41, the abutting extensions 9A and 12A of the lateral ends 9 and 12 are displaced inwardly from the extensions 9B and 12B, respectively. This establishes a space or pocket 43 between the central channel part 17A and the extensions 9A, 12A sufficient to receive the head 41B.

As above-noted, the end member 17 is joined to the lateral ends 9 and 12 of the panels 2 and 3 by sliding of the end member and lateral ends relative to each other. This can be accomplished either by sliding the end member 17 in interlocking fashion over the extensions 9B and 12B or vice versa. To permit this to be realized at intermediate positions along the lengths of these elements, the extensions 9B and 12B and the corresponding channel parts 17B and 17C are provided with aligned spaced slots along their respective lengths. FIG. 1 shows slots 51 and 52 in the extensions 9B and 12B and corresponding slots 53 and 54 in the channels part 17B and 17C. Similar sets of aligned slots (not shown) are spaced further along the lengths of the elements.

With the extensions and channel parts slotted in this fashion, by displacing the joined lateral ends 9, 12 relative to the end member 17, the slotted portions of each become aligned with unslotted portions permitting the end member to be brought into sliding relationship with the lateral ends. By then sliding the lateral ends and end member 17 relative to each other, the unslotted portions of each are brought into engagement, so that the desired interlocking of the extensions of the lateral ends and channel parts of the end member occurs.

When the end member 17 and lateral ends 9 and 12 become interlocked, the slotted segments of each also become aligned. This provides an unfinished appearance to the housing 1. In order to avoid this, the lateral ends 9 and 12 are provided with further extensions 29A and 29B which act as skirts and cover the slotted segments.

As shown, the extensions 29A and 29B are displaced inwardly from the extensions 9A and 12A and extend outward of the faces 4 and 7 of the panels 2 and 3. These extensions then extend around so as to cover the channel parts 17B and 17C of the end member 17. Accordingly, the extensions 29A and 29B effectively cover the slotted segments of the channel parts and extensions 9B and 12B.

As above noted, the antenna housing 1 (see, FIG. 5) supports the antenna 14 and the PC boards 14A and 14B which carry electrical components connected to the antenna. In order to position the antenna and PC boards in the housing 1, the panels 2 and 3 are provided with cooperating central ribs 61A and 62A which extend outward from the faces 5 and 6 of the panels. These ribs extend along the length of the faces and are spaced from each other. Furthermore, in the case shown, they are slotted at positions along their length to accommodate the three loops 14C, 14D and 14E of the antenna 14.

Also for positioning purposes, the abutting extensions 8A and 11A having L-shaped notches 8C, 11C which define a slot for capturing one end each of the PC boards 14B, 14C. Similarly, the abutting extensions 9A and 12A having L-shaped notches 9C, 12C which define an opposing slot for capturing the other end of each of the PC boards. The PC boards are thus held by the notches so as to be appropriately positioned.

Additional L-shaped notches 61, 62, 63 and 64 are provided in the facing surfaces of the channel part 16B and the extension 29A and the channel part 16C and the extension 29B. These notches provide seating areas for decorative panels if desired to be placed against the faces 4 and 7.

In the description of the housing 1 above, the end member 17 and lateral ends 9 and 12 were provided with aligned slots so as to permit the interlocking of these elements at intermediate positions along their lengths. This configuration is believed to be suitable for most installations, since in most installations the end member 17 can first be secured to the wall or doorway, the remainder of the housing 1 assembled and the lateral ends 9 and 12 of the assembled housing then interlocked with the secured end member 17. In such cases, since the end member 16 can be freely assembled with the panels, the need to slide the end member 16 over the entire length of the lateral ends 8 and 11 can be readily accomplished.

If required, however, the extensions 8B and 11B of the lateral ends 8 and 11 and the channel parts 16B and 16C can also be slotted to permit interlocking engagement at intermediate positions along their lengths. In such case, skirt extensions similar to extensions 29A and 29B to hide the slotted segments can also be added to the lateral ends 8 and 11.

As can be appreciated from the above, the housing 1 of the invention provides an aesthetically pleasing appearance due to its interlocking parts and low profile configuration. Also, the housing is simple in construction, can be readily assembled and permits access to the antenna from both the top and bottom of the housing. Furthermore, as illustrated, the panels 2 and 3 are similarly configured as are the end members 16 and 17, thus simplifying the manufacturing required for the housing parts.

In all cases it is understood that the above-described arrangements are merely illustrative of the many possible specific embodiments which represent applications of the present invention. Numerous and varied other arrangements can be readily devised in accordance with the principles of the present invention without departing from the spirit and scope of the invention.

What is claimed is:

1. An assembly for housing an antenna comprising:

first and second panels each having first and second faces and first and second lateral ends, said first and second panels being such that when said first faces of said first and second panels are in opposing relationship said first and second panels define an interior space for receiving the antenna, said first lateral ends of said first and second panels being in opposing relationship and said second lateral ends of said first and second panels being in opposing relationship when said first faces of said first and second panels are in opposing relationship;

a first end member configured to slidably interlock with and maintain together said first lateral ends of said first and second panels when in opposing relationship;

a second end member configured to slidably interlock with and maintain together said second lateral ends of said first and second panels when in opposing relationship;

and a first end cap for engaging the upper parts of and for holding together so as to prevent sliding of said first end member and first lateral ends of said first and second panels and for engaging the upper parts of and for holding together so as to prevent sliding of said second end member and said second lateral ends of said first and second panels.

2. An assembly in accordance with claim 1 further comprising:

a second end cap for engaging the lower parts of and for holding together so as to prevent sliding of said first end member and first lateral ends of said first and second panels and for engaging the lower parts of and holding together so as to prevent sliding of said second end member and said second lateral ends of said first and second panels.

3. An assembly in accordance with claim 2 wherein:

said first end cap includes first releasable locking means which locks the first end cap in a first position to hold together so as to prevent sliding of said first end member and said first lateral ends of said first and second panels and to hold together and prevent sliding of said second end member and said second lateral ends of said first and second panels and which can be released from said first locked position;

and said second end cap includes second releasable locking means which locks the second end cap in a second locked position to hold together and prevent sliding of said first end member and said first lateral ends of said first and second panels and to hold together and prevent sliding of the second end member and the second lateral ends of said first and second panels and which can be released from said second looked position.

4. An assembly in accordance with claim 1 wherein:

said first end cap includes first releasable locking means which locks the first end cap in a first locked position to hold together and prevent sliding of said first end member and said first lateral ends of said first and second panels and to hold together and prevent sliding of said second end member and said second lateral ends of said first and second panels and which can be released from said first locked position.

5. An assembly in accordance with claim 1 wherein:

said first end member has a first channel into which said first lateral ends of said first and second panels when in facing relationship can be engageably slid to interlock said first end member and said first lateral ends of said first and second panels;

and said second end member has a second channel into which said second lateral ends of said first and second panels when in opposing relationship can be engageably slid to interlock said second end member and said second lateral ends of said first and second panels.

6. An assembly in accordance with claim 5 wherein:

the first lateral end of each panel has a first extension part extending outward of the second face of that panel;

said first channel has first channel parts each extending around a different one of said first extension parts;

the second lateral end of each panel has a second extension part extending outward of the second face of that panel;

and said second channel has second channel parts each extending around a different one of said second extension parts.

7. An assembly in accordance with claim 6 wherein:

the first lateral end of each panel has a third extension part extending outward of the first face of that panel;

said third extension parts of said first lateral ends of said first and second panels being in abutting relationship when said first and second panels are in opposing relationship;

said first channel includes a first central channel part extending adjacent to said third extension parts of said first lateral ends of said first and second panels and connecting the first channel parts;

the second lateral end of each panel has a fourth extension part extending outward of the first face of that panel and which is off-set inwardly from the second extension part of that second lateral end;

said fourth extension parts of the second lateral ends of said first and second panels being in abutting relationship when said first faces of said first and second panels are in opposing relationship; and said second channel includes a second central channel part extending adjacent and spaced from said fourth extension parts and connecting the second channel parts.

8. An assembly in accordance with claim 7 wherein:

each of said first, second, third and fourth extension parts is rectangular;

each of said first and second channel parts is C-shaped;

and each first and second central channel part is flat.

9. An assembly in accordance with claim 7 wherein:

said second central channel part includes an opening through which the shank of a mounting member can be passed and whose head can be accommodated by the space between said second channel central part and said fourth extension parts.

10. An assembly in accordance with claim 7 wherein:

the second lateral end of each panel includes a fifth extension part which extends outward of the second face of that panel and which is off-set inwardly from the second extension part of that second lateral end and extends outward such that said fifth extension part covers the second channel part which surrounds that second extension part.

11. An assembly in accordance with claim 10 wherein:

each of said first channel parts extends around the first extension part so as to have a terminating end abutting the second surface of the panel from which that first extension part extends, said terminating end including a notch;

each of said fifth extension parts includes a notch where said fifth extension part abuts the second surface of the panel from which it extends.

12. An assembly in accordance with claim 7 wherein:

each of said third extension parts includes a notch at the surface at which that third extension part abuts with the other third extension part, said notches of said third extension parts together forming a first slot;

each of said fourth extension parts includes a notch at the surface at which that fourth extension part abuts the other fourth extension part, said notches of said fourth extension parts together forming a second slot.

13. An assembly in accordance with claim 12 further comprising:

a first rib situated centrally of said first panel and extending outward of said first surface of said first panel;

a second rib situated centrally of said second panel and extending outward of said first surface of said second panel;

said first and second ribs being in spaced opposing relationship when said first faces of said first and second panels are brought int opposing relationship.

14. An assembly in accordance with claim 7 wherein:

each of said first and second central channel parts includes a recess in the outer surface of that central channel part.

15. An assembly in accordance with claim 7 wherein:

said first end cap includes: a top wall, first and second side walls extending downwardly from said top wall; and first and second bottom walls extending inwardly toward each other from said first and second sidewalls, respectively;

the upper end of each first extension part has an upper slot extending through the thickness of the first extension part surrounded by a first channel part and extending inwardly from an outer surface toward the second surface of the panel from which that first extension part extends;

the upper end of each first channel part has an upper slot through the thickness of that first channel part and extending such as to permit access to and along the inner surface of the upper slot of the first extension part surrounded by that first channel part;

the upper end of each second extension part has an upper slot extending through the thickness of the second extension part surrounded by a second channel part and extending inwardly from an outer surface toward the second surface of the second panel from which that second extension extends;

the upper end of each second channel part has an upper slot extending through the thickness of that second channel part and extending such as to permit access to and along the inner surface of the upper slot of the second extension part surrounded by that second channel part;

and said first and second bottom walls of said first end cap, respectively, engage and extend along said upper slots in said upper ends of said first extension parts and first channel parts and said upper slots in said second extension parts and said second channel parts.

16. An assembly in accordance with claim 15 wherein:

said first and second bottom walls each have a bendable part, said bendable parts of said first and second bottom walls being forward of and engaging said first channel parts, and preventing said cap from being slid from engagement with said upper slots in said first and second extension parts and first and second channel parts unless said bendable parts are bent upwardly to release said engagement of said bendable parts and said first channel parts.

17. An assembly in accordance with claim 16 wherein:

each of said bottom walls comprises a front section followed by a middle section which is flexible and is bent downwardly from the front section and is followed by and spaced from a back section, said middle section being spaced from the side wall from which the bottom wall including that middle section extends and forming the bendable part of that bottom wall.

18. An assembly in accordance with claim 7 wherein:

said second extension parts of said first and second lateral ends have slots along corresponding length portions of said second extension parts;

said second channel parts of said second channel have slots along corresponding length portions of said second channel parts;

said slots in said second extension parts and said slots in said second channel parts being such as to allow said second extension parts to be brought into slidable engagement with said second channel parts at an intermediate position along their lengths.

19. An assembly in accordance with claim 7 further comprising:

a second end cap for engaging the lower parts of and for holding together so as to prevent sliding of said first end member and first lateral ends of said first and second panels and for engaging the lower parts of and holding together so as to prevent sliding of said second end member and said second lateral ends of said first and second panels, said second end cap comprising: a bottom member; first and second side members extending upwardly from said bottom member; and first and second top members extending inwardly toward each other from said first and second side members, respectively;

the lower end of each first extension part has a lower slot extending through the thickness of the first extension part surrounded by a first channel part and extending inwardly from an outer surface toward the second surface of the panel from which that first extension part extends;

the lower end of each first channel part has a lower slot through the thickness of that first channel part and extending such as to permit access to and along the inner surface of the lower slot of the first extension part surrounded by that first channel part;

the lower end of each second extension part has a lower slot extending through the thickness of the second extension part surrounded by a second channel part and extending inwardly from an outer surface toward the second surface of the second panel from which that second extension extends;

the lower end of each second channel part has a lower slot through the thickness of that second channel part and extending such as to permit access to and along the inner surface of the second extension part surrounded by that second channel part;

and said first and second top members of said second end cap, respectively, engage and extend along said lower slots in said lower ends of said first extension parts and first channel parts and said lower slots in said extension parts and said second channel parts.

20. An antenna assembly comprising:

an antenna;

a housing having first and second panels each having first and second faces and first and second lateral ends, said first and second panels being such that when said first faces of said first and second panels are in opposing relationship said first and second panels define an interior space receiving said antenna, said first lateral ends of said first and second panels being in opposing relationship and said second lateral ends of said first and second panels being in opposing relationship when said first faces of said first and second panels are in opposing relationship;

a first end member configured to slidably interlock with and maintain together said first lateral ends of said first and second panels when in opposing relationship;

a second end member configured to slidably interlock with an maintain together said second lateral ends of said first and second panels when in opposing relationship;

and a first end cap for engaging the upper parts of and for holding together so as to prevent sliding of said first end member and first lateral ends of said first and second panels and for engaging the upper parts of and for holding together so as to prevent sliding of said second end member and said second lateral ends of said first and second panels.

21. An assembly in accordance with claim 20 further comprising:

first and second PC boards disposed in said housing at opposite ends of said antenna.

* * * * *